United States Patent
Umakoshi et al.

(10) Patent No.: US 8,710,662 B2
(45) Date of Patent: Apr. 29, 2014

(54) LIGHT-REFLECTIVE ANISOTROPIC CONDUCTIVE PASTE AND LIGHT-EMITTING DEVICE

(75) Inventors: Hideaki Umakoshi, Tochigi (JP); Hidetsugu Namiki, Tochigi (JP); Akira Ishigami, Tochigi (JP); Masaharu Aoki, Tochigi (JP); Shiyuki Kanisawa, Tochigi (JP); Yoshihisa Shinya, Tochigi (JP)

(73) Assignee: Sony Corporation & Information Device Corporation, Tokyo (JP)

( * ) Notice: Subject to any disclaimer, the term of this patent is extended or adjusted under 35 U.S.C. 154(b) by 0 days.

(21) Appl. No.: 13/516,005

(22) PCT Filed: May 27, 2011

(86) PCT No.: PCT/JP2011/062216
§ 371 (c)(1),
(2), (4) Date: Jun. 14, 2012

(87) PCT Pub. No.: WO2011/155348
PCT Pub. Date: Dec. 15, 2011

(65) Prior Publication Data
US 2012/0248495 A1      Oct. 4, 2012

(30) Foreign Application Priority Data
Jun. 9, 2010   (JP) .................................. 2010-132501

(51) Int. Cl.
*H01L 23/48*   (2006.01)

(52) U.S. Cl.
USPC ...................... 257/753; 257/99; 257/E23.166

(58) Field of Classification Search
USPC ............ 257/99, 100, 753, E23.018, E23.075, 257/E23.166
See application file for complete search history.

(56) References Cited

U.S. PATENT DOCUMENTS 6,096,411 A * 8/2000 Nakatani et al. .............. 428/209
8,450,764 B2 * 5/2013 Suzuki et al. .................. 257/99

(Continued)

FOREIGN PATENT DOCUMENTS

JP   A-08-073568   3/1996
JP   A-10-245378   9/1998

(Continued)

OTHER PUBLICATIONS

International Preliminary Report on Patentability issued in Application No. PCT/JP2011/062216; Dated Jan. 15, 2013 (With Translation).

(Continued)

*Primary Examiner* — Quoc Hoang
(74) *Attorney, Agent, or Firm* — Oliff PLC

(57) ABSTRACT

A light-reflective anisotropic conductive paste is used as an anisotropic conductive paste when a light-emitting device is produced by flip-chip mounting a light-emitting element such as a light-emitting diode element (LED) on a wiring board. The light-reflective anisotropic conductive paste includes light-reflective insulating particles, in order to improve light emission efficiency without providing, in the LED, a light-reflecting layer that causes an increase in manufacturing cost. With the light-reflective anisotropic conductive paste, a reduction in bonding strength of the light-emitting element to the wiring board in a high-temperature environment can be suppressed, and a reduction in conduction reliability after a TCT can also be suppressed. In the light-reflective anisotropic conductive paste, conductive particles and the light-reflective insulating particles are dispersed in a thermosetting resin composition. The thermosetting resin composition contains an epoxy compound and a thermal catalyst-type curing agent.

23 Claims, 7 Drawing Sheets

(56) References Cited

U.S. PATENT DOCUMENTS

2010/0193228 A1  8/2010  Shinya et al.
2012/0193666 A1* 8/2012  Namiki et al. .................. 257/98

FOREIGN PATENT DOCUMENTS

| | | |
|---|---|---|
| JP | A-10-310587 | 11/1998 |
| JP | A-11-168235 | 6/1999 |
| JP | A-11-203938 | 7/1999 |
| JP | A-11-343465 | 12/1999 |
| JP | A-2001-332124 | 11/2001 |
| JP | A-2004-155957 | 6/2004 |
| JP | A-2006-096742 | 4/2006 |
| JP | A-2007-123613 | 5/2007 |
| JP | A-2008-308596 | 12/2008 |
| JP | A-2009-098637 | 5/2009 |

OTHER PUBLICATIONS

International Search Report issued in Application No. PCT/JP2011/062216; Dated Jun. 21, 2011 (With Translation).

* cited by examiner

US 8,710,662 B2

LIGHT-REFLECTIVE ANISOTROPIC CONDUCTIVE PASTE AND LIGHT-EMITTING DEVICE

TECHNICAL FIELD

The present invention relates to a light-reflective anisotropic conductive paste used to connect a light-emitting element such as a light-emitting diode element (LED) to a wiring board by anisotropic conductive connection and to a light-emitting device in which a light-emitting element is mounted on a wiring board using the paste.

BACKGROUND ART

Light-emitting devices using light-emitting diode elements (LEDs) are widely used. An old-type light-emitting device has a structure shown in FIG. 8. More specifically, an LED 33 is bonded to a substrate 31 through a die-bonding adhesive 32, and a p electrode 34 and an n electrode 35 on the upper surface of the LED 33 are wire-bonded to connection terminals 36 of the substrate 31 through gold wires 37. The entire LED 33 is sealed with a transparent molding resin 38. However, in the light-emitting device shown in FIG. 7, light having a wavelength of 400 to 500 nm and contained in the light emitted from the LED 33 to the upper surface side is absorbed by the gold wires, and part of the light emitted to the lower surface side is absorbed by the die-bonding adhesive 32. This causes a problem in that the light emission efficiency of the LED 33 is reduced.

In view of the above, Patent Literature 1 proposes flip-chip mounting of an LED 33, as shown in FIG. 7. In this flip-chip mounting technology, bumps 39 are formed on a p electrode 34 and an n electrode 35, and a light reflecting layer 40 is provided on the bump-formed surface of the LED 33 so as to be insulated from the p electrode 34 and the n electrode 35. The LED 33 and a substrate 31 are connected to each other using an anisotropic conductive paste 41 and secured to each other by curing the paste 41. Therefore, in the light-emitting device in FIG. 7, the light emitted upward from the LED 33 is not absorbed by gold wires, and most of the light emitted downward from the LED 33 is reflected by the light reflecting layer 40 and then emitted upward, so that light emission efficiency (light extraction efficiency) is not reduced. A paste prepared by dispersing conductive particles in a thermosetting resin composition containing an epoxy compound serving as a curing component and an imidazole-based latent curing agent capable of curing the epoxy compound through an addition reaction is widely used as such an anisotropic conductive paste 41.

CITATION LIST

Patent Literature

[Patent Literature 1] Japanese Patent Application Laid-Open No. Hei. 11-168235

SUMMARY OF THE INVENTION

Technical Problem

However, with the technology in Patent Literature 1, the light reflecting layer 40 must be provided on the LED 33 by, for example, a metal vapor deposition method so as to be insulated from the p electrode 34 and the n electrode 35, and this causes a problem in that an increase in manufacturing cost is unavoidable. When no light reflecting layer 40 is provided, a problem arises in that it is difficult to increase the light emission efficiency (light extraction efficiency) of light emitted by the light-emitting element. This is because the surfaces of the gold-, nickel-, or copper-coated conductive particles contained in the cured anisotropic conductive paste or an anisotropic conductive film assume a brown to dark brown color and because the epoxy resin binder containing the conductive particles dispersed therein also assumes a brown color due to the imidazole-based latent curing agent commonly used to cure the binder.

In view of the above, the present inventors have prepared an anisotropic conductive paste that can suppress the reduction in light emission efficiency by adding light-reflective insulating particles to the anisotropic conductive paste in order to allow the anisotropic conductive paste itself to have a light-reflecting function. In addition, instead of the imidazole-based latent curing agent that causes coloration of the cured product of the anisotropic conductive paste, an acid anhydride-based curing agent is used to impart light reflectivity to the paste. Then, the inventors have produced a light-emitting device by connecting a light-emitting element to a wiring board by anisotropic conductive connection using the anisotropic conductive paste and have found that the reduction in the light emission efficiency of the light-emitting element is lower than expected.

However, the thus-produced light-emitting device has a problem in that, when it is placed in a high-temperature environment, the bonding strength of the anisotropic conductive paste that connects the light-emitting element to the wiring board is significantly reduced. This reduction occurs not only in the high-temperature environment but also in a room temperature environment that is reached after the light-emitting device in the high-temperature environment is allowed to cool. Another problem is that conduction reliability is significantly reduced after a thermal cycle test (TCT).

It is an object of the present invention to solve the foregoing problems in the conventional technology and to provide a light-reflective anisotropic conductive paste used as an anisotropic conductive paste when a light-emitting device is produced by flip-chip mounting a light-emitting element such as a light-emitting diode element (LED) on a wiring board. More specifically, the present invention provides a light-reflective anisotropic conductive paste containing light-reflective insulating particles, in order to improve light emission efficiency without providing a light-reflecting layer to the LED that causes an increase in manufacturing cost. In this case, the light-reflective anisotropic conductive paste can suppress the reduction in the bonding strength of the light-emitting element to the wiring board in a high-temperature environment and can also suppress the reduction in conduction reliability after a TCT. It is another object to provide a light-emitting device produced by flip-chip mounting a light-emitting element to a wiring board using the above paste.

Solution to Problem

The present inventors have made studies on curing agents for an epoxy compound added to a thermosetting resin composition contained in a light-reflective anisotropic conductive paste and have obtained the following findings. Since polymerization of the epoxy compound with an acid anhydride-based curing agent proceeds through an addition reaction, a large amount of the acid anhydride-based curing agent must be added to the polymerization system. In addition, since such an acid anhydride-based curing agent is easily volatilized, the compositional ratio of the thermosetting resin composition is significantly changed during anisotropic conductive connection. Under the assumption that the change in the compositional ratio causes a significant reduction in both the bonding strength and conduction reliability of the anisotropic conductive paste, the inventors have found that the above objects can be achieved by using, instead of an acid anhydride-based curing agent that cures the thermosetting resin composition through an addition polymerization reaction with the epoxy compound, a thermal catalyst-type curing agent, only a small amount of which can initiate curing of the thermosetting resin composition by ring-opening polymerization of epoxy groups under heating. Thus, the present invention has been completed.

Accordingly, the present invention provides a light-reflective anisotropic conductive paste used to connect a light-emitting element to a wiring board by anisotropic conductive connection, the light-reflective anisotropic conductive paste including a thermosetting resin composition, conductive particles, and light-reflective insulating particles, the conductive particles and the light-reflective insulating particles being dispersed in the thermosetting resin composition, wherein the thermosetting resin composition contains an epoxy compound and a thermal catalyst-type curing agent.

The present invention also provides a light-emitting device including a light-emitting element, a wiring board, and the above-described light-reflective anisotropic conductive paste, the light-emitting element being flip-chip mounted on the wiring board through the light-reflective anisotropic conductive paste.

Advantageous Effects of the Invention

The light-reflective anisotropic conductive paste of the present invention used to connect a light-emitting element to a wiring board by anisotropic conductive connection uses, as the curing agent added to the thermosetting resin composition containing the epoxy compound as a primary curable component, a thermal catalyst-type curing agent capable of initiating thermal cationic polymerization or thermal anionic polymerization. Therefore, thermal cationic polymerization or thermal anionic polymerization is initiated by the thermal catalyst-type curing agent without addition polymerization reaction, and the polymerization proceeds as a chain reaction, so that the chemical composition of the thermosetting resin composition is not significantly changed by the volatilization of the thermal catalyst-type curing agent during pressurization under heating for anisotropic conductive connection. Accordingly, the reduction in bonding strength and the reduction in connection reliability in a high-temperature environment can be suppressed.

DESCRIPTION OF EMBODIMENTS

Figure 1A:
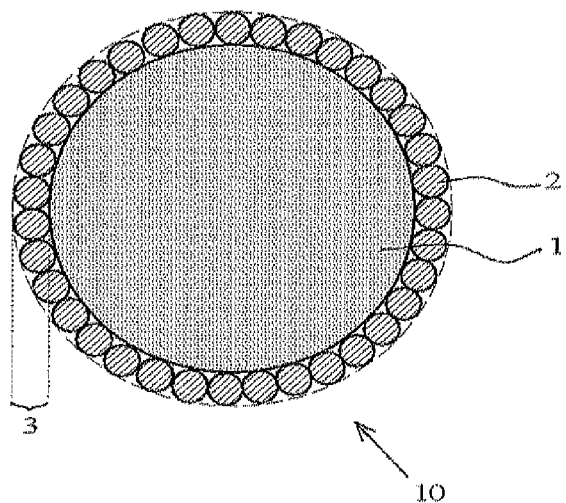
FIG. 1A is a cross-sectional view of a light-reflective conductive particle for an anisotropic conductive paste.

The present invention provides a light-reflective anisotropic conductive paste used to connect a light-emitting element to a wiring board by anisotropic conductive connection. In the light-reflective anisotropic conductive paste, conductive particles and light-reflective insulating particles are dispersed in a thermosetting resin composition, and the thermosetting resin composition contains an epoxy compound and a thermal catalyst-type curing agent.

The thermosetting resin composition used in the present invention contains an epoxy compound as a primary curable component and further contains a thermal catalyst-type curing agent serving as a polymerization initiator for thermal anionic polymerization or thermal cationic polymerization of the epoxy compound. The thermal catalyst-type curing agent used is preferably a thermal anionic polymerization catalyst-type curing agent or a thermal cationic polymerization catalyst-type curing agent. A thermal cationic polymerization catalyst-type curing agent is used more preferably because high adhesion can be obtained.

A Lewis base known as a thermal anionic polymerization catalyst can be used as the thermal anionic polymerization catalyst-type curing agent. Particularly, amine-based Lewis bases can be preferably used, because curing conditions (temperature, time) can be selected from a relatively wide range of conditions. Specific examples of such amine-based Lewis bases include tertiary amine compounds such as benzyldimethylamine (BDMA) and 2,4,6-trisdimethylaminomethylphenol (DMP-30).

A Lewis acid known as a thermal cationic polymerization catalyst can be used as the thermal cationic polymerization catalyst-type curing agent. Examples of such a Lewis acid include boron trifluoride and aromatic onium salts. Particularly, aromatic onium salts can be preferably used because thermal decomposition can be relatively easily controlled.

Examples of such aromatic onium salts include aromatic iodonium salts and aromatic sulfonium salts, and preferred examples include a sulfonium borate complex represented by the formula (1).

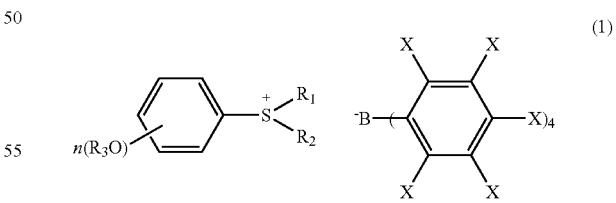

In the formula (1), $R_1$ is an aralkyl group, $R_2$ is a loweralkyl group, and $R_3$ is a hydrogen atom or a loweralkoxycarbonyl group. X represents a halogen atom, and n is an integer from 1 to 3.

Examples of the aralkyl group represented by $R_1$ in the formula (1) include a benzyl group, an o-methylbenzyl group, a (1-naphthyl)methyl group, a pyridylmethyl group, and an anthracenylmethyl group. Of these, an o-methylbenzyl group is preferred because of its fast curability and availability.

Examples of the loweralkyl group represented by $R_2$ include a methyl group, an ethyl group, a propyl group, and a butyl group. Of these, a methyl group is preferred because of its fast curability and availability.

The n representing the number of hydroxyl groups or loweralkoxycarbonyloxy groups in the phenyl group bonded to the sulfonium residue is an integer from 1 to 3. Examples of such a phenyl group when n is 1 include a 4-hydroxyphenyl group, a 4-loweralkoxycarbonyloxyphenyl group, a 2-hydroxyphenyl group, a 2-loweralkoxycarbonyloxyphenyl group, a 3-hydroxyphenyl group, and a 3-loweralkoxycarbonyloxyphenyl group. Examples of the phenyl group when n is 2 include a 2,4-dihydroxyphenyl group, a 2,4-di-loweralkoxycarbonyloxyphenyl group, a 2,6-dihydroxyphenyl group, a 2,6-di-loweralkoxycarbonyloxyphenyl group, a 3,5-dihydroxyphenyl group, a 3,5-di-loweralkoxycarbonyloxyphenyl group, a 2,3-dihydroxyphenyl group, and a 2,3-di-loweralkoxycarbonyloxyphenyl group. Examples of the phenyl group when n is 3 include a 2,4,6-tri-hydroxyphenyl group, a 2,4,6-tri-loweralkoxycarbonyloxyphenyl group, a 2,4,5-trihydroxyphenyl group, a 2,4,5-tri-loweralkoxycarbonyloxyphenyl group, a 2,3,4-trihydroxyphenyl group, and a 2,3,4-tri-loweralkoxycarbonyloxyphenyl group. Of these, a 4-hydroxyphenyl group with n=1 and a 4-loweralkoxycarbonyloxyphenyl group with n=1 are preferred because of their fast curability and availability, and a 4-methoxycarbonyloxyphenyl group is particularly preferred.

The halogen atom represented by X is a fluorine atom, a chlorine atom, a bromine atom, or an iodine atom. Of these, a fluorine atom having high electron withdrawing ability is preferred from the viewpoint of improvement in reactivity.

Therefore, specific preferred examples of the aromatic sulfonium salt include sulfonium borate complexes represented by the formulas (1a), (1b), (1c), and (1A) below, and the sulfonium borate complex represented by the formula (1A) is particularly preferred.

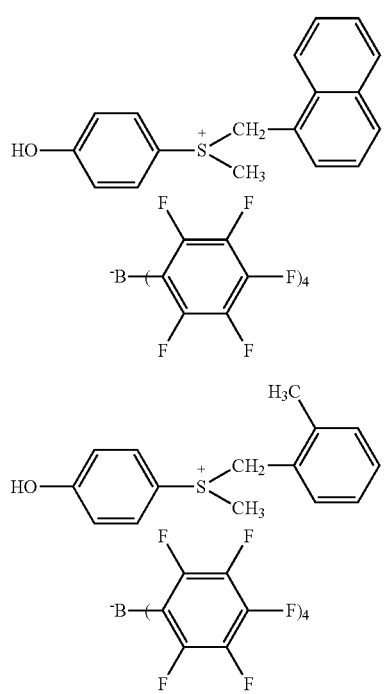

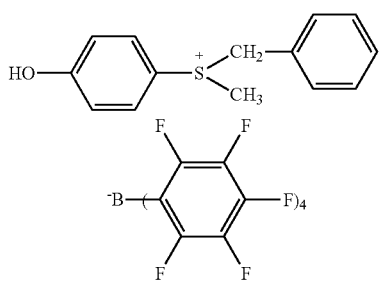

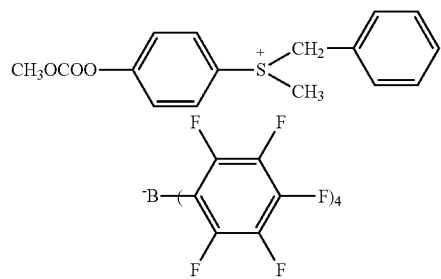

The sulfonium borate complex of the formula (1) can be produced according to the following reaction formula. The respective substituents in the formulas (1), (2), and (3) are as described above. More specifically, $R_1$ is an aralkyl group, $R_2$ is a loweralkyl group, and $R_3$ is a hydrogen atom or a loweralkoxycarbonyl group. X represents a halogen atom, and n is an integer from 1 to 3.

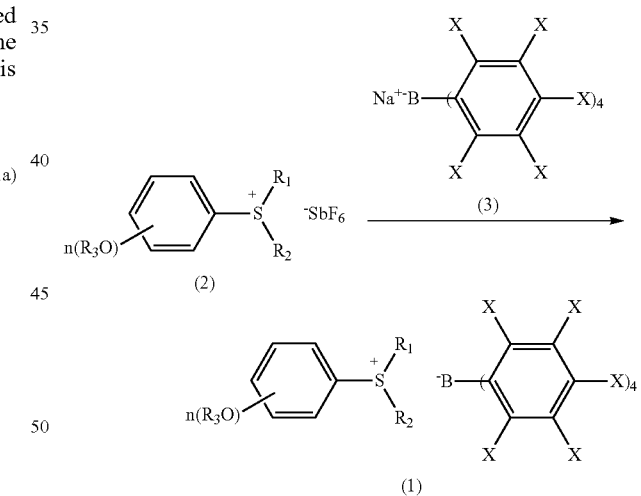

The sulfonium borate complex of the formula (1) with $R_3$ being a hydroxyl group can be obtained by: dissolving a sulfonium antimonate complex of the formula (2) with $R_3$ being a hydroxyl group (see Japanese Patent Application Laid-Open No. Hei. 10-245378 for its synthesis method) in an organic solvent such as ethyl acetate; mixing the obtained solution with an equal molar amount of an aqueous solution of a sodium borate salt of the formula (3) (see Japanese Patent Application Laid-Open No. Hei. 10-310587 for its synthesis method); and stirring the obtained two-phase mixture at a temperature of 20 to 80° C. for 1 to 3 hours to allow the sulfonium antimonate complex of the formula (2) to react with the sodium borate salt of the formula (3). The sulfonium borate complex of the formula (1) can be isolated by separating the organic solvent layer, drying the separated organic solvent layer, and then removing the organic solvent by evaporation under reduced pressure. The target compound is obtained as an evaporation residue.

The sulfonium borate complex of the formula (1) with $R_3$ being a loweralkoxycarbonyl group can be obtained by: dissolving a sulfonium antimonate complex of the formula (2) (see Japanese Patent Application Laid-Open No. 2006-96742 for its synthesis method. More specifically, a hydroxyphenylsulfonium antimonate complex corresponding to a compound obtained by removing a formate residue from the complex of the formula (2) is reacted with a loweralkyl chloroformate compound (for example, methyl chloroformate) in acetonitrile in the presence of triethylamine) in an organic solvent such as ethyl acetate; mixing the obtained solution with an equal molar amount of an aqueous solution of the sodium borate salt of the formula (3) (see Japanese Patent Application Laid-Open No. Hei. 10-310587 for its synthesis method); and stirring the obtained two-phase mixture at a temperature of 20 to 80° C. for 1 to 3 hours to allow the sulfonium antimonate complex of the formula (2) to react with the sodium borate salt of the formula (3). The sulfonium borate complex of the formula (1) can be isolated by separating the organic solvent layer, drying the separated organic solvent layer, and then removing the organic solvent by evaporation under reduced pressure. The target compound is obtained as an evaporation residue.

Any thermosetting epoxy compound conventionally used for bonding of electronic materials can be appropriately used as the epoxy compound contained in the thermosetting resin composition used in the present invention. Such a thermosetting epoxy compound may be in a liquid form or in a solid form. The epoxy equivalent of such a thermosetting epoxy compound is generally about 100 to about 4,000, and a thermosetting epoxy compound having at least two epoxy groups in its molecule is preferably used. Preferred examples of the thermosetting epoxy compound that can be used include bisphenol-A type epoxy compounds, phenol novolac type epoxy compounds, cresol novolac type epoxy compounds, ester type epoxy compounds, and alicyclic epoxy compounds. These compounds include monomers and oligomers.

In addition to the above-described epoxy compounds, a heterocyclic epoxy compound, a hydrogenated epoxy compound, and the like may be used if necessary.

Examples of the heterocyclic epoxy compound include epoxy compounds having a triazine ring, and particularly preferred examples include 1,3,5-tris(2,3-epoxypropyl)-1,3,5-triazine-2,4,6-(1H,3H,5H)-trione.

Any of hydrogenated products of the above-described alicyclic epoxy compounds and heterocyclic epoxy compounds and other well-known hydrogenated epoxy resins can be used as the hydrogenated epoxy compound.

The alicyclic epoxy compounds, the heterocyclic epoxy compounds, and the hydrogenated epoxy compounds may be used alone or in combination of two or more types. Particularly, it is preferable to always use an alicyclic epoxy compound because a relatively high visible light transmittance can be achieved. Specific examples of such an alicyclic epoxy compound include glycidylhexahydrobisphenol A and 3,4-epoxycyclohexenylmethyl-3',4'-epoxycyclohexene carboxylate. Of these, glycidylhexahydrobisphenol A and 3,4-epoxycyclohexenylmethyl-3',4'-epoxycyclohexene carboxylate can be preferably used because they have fast curability and their cured products have light transmittance suitable for, for example, mounting of LEDs.

Other epoxy compounds may also be used in addition to the above-described epoxy compounds, so long as the effects of the present invention are not impaired. Examples of such epoxy compounds include: glycidyl ethers obtained by reacting epichlorohydrin with polyphenols such as bisphenol A, bisphenol F, bisphenol S, tetramethyl bisphenol A, diaryl bisphenol A, hydroquinone, catechol, resorcin, cresol, tetrabromo bisphenol A, trihydroxybiphenyl, benzophenone, bisresorcinol, bisphenolhexafluoroacetone, tetramethyl bisphenol A, tetramethyl bisphenol F, tris(hydroxyphenyl)methane, bixylenol, phenol novolac, and cresol novolac; polyglycidyl ethers obtained by reacting epichlorohydrin with aliphatic polyalcohols such as glycerin, neopentyl glycol, ethylene glycol, propylene glycol, butylene glycol, hexylene glycol, polyethylene glycol, and polypropylene glycol; glycidyl ether esters obtained by reacting epichlorohydrin with hydroxy carboxylic acids such as p-oxybenzoic acid and β-oxynaphthoic acid; polyglycidyl esters obtained from polycarboxylic acids such as phthalic acid, methylphthalic acid, isophthalic acid, terephthalic acid, tetrahydrophthalic acid, endomethylene tetrahydrophthalic acid, endomethylene hexahydrophthalic acid, trimellitic acid, and polymerized fatty acids; glycidylaminoglycidyl ethers obtained from aminophenols and aminoalkylphenols; glycidylaminoglycidyl esters obtained from amino benzoic acids; glycidylamines obtained from aniline, toluidine, tribromoaniline, xylylenediamine, diaminocyclohexane, bisaminomethylcyclohexane, 4,4'-diaminodiphenylmethane, and 4,4'-diaminodiphenylsulfone; and well-known epoxy resins such as epoxidized polyolefin.

When the amount of the thermal catalyst-type curing agent in the thermosetting resin composition used in the present invention is too small, curing is not sufficient. When the amount is too large, storage stability deteriorates. Therefore, the amount of the thermal catalyst-type curing agent is preferably 0.1 to 7 parts by mass based on 100 parts by mass of the epoxy compound and more preferably 0.5 to 3 parts by mass.

In the thermosetting resin composition used in the present invention, in addition to the above-described epoxy compounds used as primary curable components, thermosetting resins such as thermosetting urea resins, thermosetting melamine resins, and thermosetting phenol resins and thermoplastic resins such as polyester resins and polyurethane resins may be used, so long as the effects of the invention are not impaired.

If necessary, the thermosetting resin composition used in the present invention may contain a pigment, an antistatic agent, an antioxidant, a silane coupling agent, a solvent, and the like.

The thermosetting resin composition used in the present invention can be prepared by uniformly mixing the epoxy compounds, the thermal catalyst-type curing agent, and the like. These components may not be mixed in advance and may be mixed together with conductive particles and light-reflective insulating particles described later.

Preferably, the above-described thermosetting resin composition used is as colorless and transparent as possible. This is to prevent a reduction in the light reflection efficiency of the light-reflective insulating particles in the anisotropic conductive paste and to allow incident light to be reflected without any change in the color of the incident light. The term "colorless and transparent" means that the light transmittance (JIS K7105) of the cured product of the anisotropic conductive paste for visible light having a wavelength of 380 to 780 nm at an optical path length of 1 cm is 80% or higher and preferably 90% or higher.

The light-reflective insulating particles dispersed in the above-described thermosetting resin composition are used to reflect light incident on the anisotropic conductive paste to the outside.

The particles having light reflectivity include: metal particles; metal particles coated with resin; inorganic particles of metal oxides, metal nitrides, metal sulfides, and the like that assume a gray to white color under natural light; particles obtained by coating resin core particles with inorganic particles; and particles of any material with irregularities on their surfaces. However, of these particles, metal particles are excluded from the light-reflective insulating particles that can be used in the present invention, because such particles must have insulating properties. Among the above metal oxide particles, conductive particles such as ITO particles cannot be used. Among inorganic particles having light reflectivity and insulating properties, inorganic particles, such as $SiO_2$ particles, having a refractive index lower than the reflective index of the thermosetting resin composition used cannot be used.

Preferred specific examples of such light-reflective insulating particles include inorganic particles formed of at least one selected from the group consisting of titanium oxide ($TiO_2$), boron nitride (BN), zinc oxide (ZnO), and aluminum oxide ($Al_2O_3$). Of these, $TiO_2$ is preferably used because of its high refractive index. These inorganic particles themselves assume a substantially white color. Therefore, the wavelength dependence of their reflection characteristics for visible light is small, and light emission efficiency can thereby be improved. In addition, light from a light-emitting element can be reflected without any change in its original color.

The light-reflective insulating particles may have a spherical shape, a scale-like shape, an irregular shape, a needle-like shape, and the like. However, in consideration of reflection efficiency, a spherical shape and a scale-like shape are preferred. When the light-reflective insulating particles are spherical, if the size of the particles is too small, their reflectivity tends to be low. If the size is too large, the connection by the anisotropic conductive particles tends to be inhibited. Therefore, the size of the spherical light-reflective insulating particles is preferably 0.02 to 20 μm and more preferably 0.2 to 1 μm. When the light-reflective insulating particles have a scale-like shape, their major axis diameter is preferably 0.1 to 100 μm and more preferably 1 to 50 μm, their minor axis diameter is preferably 0.01 to 10 μm and more preferably 0.1 to 5 μm, and their thickness is preferably 0.01 to 10 μm and more preferably 0.1 to 5 μm.

The refractive index (JIS K7142) of the light-reflective insulating particles composed of inorganic particles is preferably larger than the refractive index (JIS K7142) of the cured product of the thermosetting resin composition and more preferably larger by at least about 0.02. This is because when the difference in refractive index is small, the reflection efficiency at the boundary between the particles and the cured product becomes small.

The light-reflective insulating particles used may be the inorganic particles described above but may be resin-coated metal particles obtained by coating the surfaces of scale-like or spherical metal particles with a transparent insulating resin. Examples of the metal particles include nickel, silver, and aluminum particles. Examples of the shape of the particles include irregular, spherical, scale-like, and needle-like shapes. Of these, a spherical shape is preferred in terms of light diffusion effects, and a scale-like shape is preferred in terms of total reflection effects. Scale-like silver particles are particularly preferred in terms of their light reflectivity. Preferably, γ-glycidoxy groups, vinyl groups, and the like are introduced in advance to the surfaces of the metal particles using a silane coupling agent. These resin-coated metal particles themselves assume a substantially white color. Therefore, the wavelength dependence of their reflection characteristics for visible light is small, and light emission efficiency can thereby be improved. In addition, light from a light-emitting element can be reflected without any change in its original color.

The preferred size of the resin-coated metal particles used as the light-reflective insulating particles depends on their shape. Generally, if the size is too large, the connection by the anisotropic conductive particles may be inhibited. If the size is too small, light is less likely to be reflected. Therefore, when the resin-coated metal particles are spherical, their particle diameter is preferably 0.1 to 30 μm and more preferably 0.2 to 10 μm. When the resin-coated metal particles have a scale-like shape, their major-axis diameter is preferably 0.1 to 100 μm and more preferably 1 to 50 μm, and their thickness is preferably 0.01 to 10 μm and more preferably 0.1 to 5 μm. When the light-reflective insulating particles have an insulating coating, the size of the particles includes the size of the insulating coating.

Any of various insulating resins can be used as the resin for the resin-coated metal particles. In terms of mechanical properties, transparency, and the like, the cured product of an acrylic-based resin can be preferably used. Preferred examples of such a resin include a resin obtained by radical copolymerization of methyl methacrylate and 2-hydroxyethyl methacrylate in the presence of a radical initiator such as an organic peroxide (for example, benzoyl peroxide). In this case, it is more preferable that the cured product be cross-linked by an isocyanate-based cross-linking agent such as 2,4-tolylenediisocyanate.

Such resin-coated metal particles can be produced, for example, by adding metal particles and a silane coupling agent to a solvent such as toluene, stirring the mixture at room temperature for about 1 hour, adding thereto a radical monomer, a radical polymerization initiator, and, if necessary, a cross-linking agent, and stirring the resultant mixture under heating at the starting temperature of radical polymerization.

If the amount of the above-described light-reflective insulating particles in the light-reflective anisotropic conductive paste is too small, sufficient light reflection cannot be achieved. When the amount is too large, connection based on the conductive particles used is inhibited. Therefore, the amount of the light-reflective insulating particles is preferably 40 to 120 parts by mass based on 100 parts by mass of the thermosetting resin composition and more preferably 50 to 100 parts by mass.

Metal particles conventionally used as conductive particles for anisotropic conductive connection can be used as the conductive particles contained in the light-reflective anisotropic conductive paste of the present invention. Examples of such particles include gold, nickel, copper, silver, solder, palladium, and aluminum particles, particles of alloys thereof, and particles of a layered product thereof (for example, a layered product including nickel plating and gold flash plating). Of these, gold, nickel, and copper make the conductive particles brown and therefore can provide the effects of the present invention more effectively than other metal materials.

The metal particles used as the conductive particles may have a spherical shape, a flake-like shape, a needle-like shape, or a clustered shape or may have a shape with a plated metal (for example, nickel) formed into a needle-like shape on its surface.

From the viewpoint of the occurrence of short circuits and conduction reliability, the metal particles used as the conductive particles have a diameter of preferably 0.2 to 10 μm and more preferably 1 to 7 μm when they are spherical. When the metal particles have a flake-like shape, they have a thickness of preferably 0.2 to 0.4 μm and a major axis diameter of preferably 1 to 10 μm.

Metal-coated resin particles obtained by coating resin particles with a metal material may be used as the conductive particles. Examples of such resin particles include styrene-based resin particles, benzoguanamine resin particles, and nylon resin particles. Any well-known method can be used to coat the resin particles with the metal material. For example, electroless plating or electroplating can be used. The thickness of the coating metal material depends on the diameter of the resin particles and the type of the metal, and the thickness sufficient to ensure good connection reliability is generally 0.1 to 3 μm.

If the diameter of the resin particles is too small, conduction failure tends to occur. If the diameter is too large, a short circuit between traces tends to occur. Therefore, the diameter of the resin particles is preferably 1 to 20 μm, more preferably 3 to 10 μm, and particularly preferably 3 to 5 μm. In this case, the shape of core particles 1 is preferably spherical but may be a flake-like shape or a rugby ball shape.

Preferred metal-coated resin particles have a spherical shape. If the diameter of the particles is too large, a reduction in connection reliability occurs. Therefore, the diameter is preferably 1 to 20 μm and more preferably 3 to 10 μm.

Figure 1B:
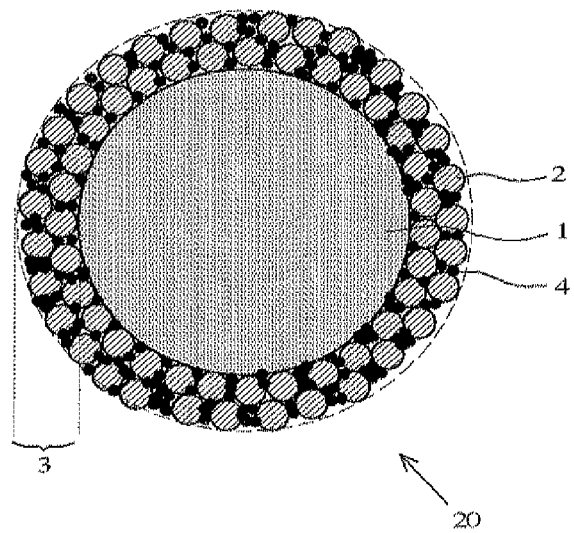
FIG. 1B is a cross-sectional view of a light-reflective conductive particle for an anisotropic conductive paste.

Particularly, in the present invention, it is preferable to impart light reflectivity to the above-described conductive particles to form light-reflective conductive particles. FIGS. 1A and 1B are cross-sectional views of light-reflective conductive particles 10 and 20. The light-reflective conductive particle shown in FIG. 1A will first be described.

The light-reflective conductive particle 10 includes a core particle 1 coated with a metal material and a light reflecting layer 3 disposed on the surface of the core particle 1 and formed of at least one type of inorganic particles 2 selected from titanium oxide (TiO$_2$) particles, zinc oxide (ZnO) particles, and aluminum oxide (Al$_2$O$_3$) particles. The titanium oxide particles, zinc oxide particles, and aluminum oxide particles are inorganic particles that assume a white color under sunlight. Therefore, the light reflecting layer 3 formed of such particles assumes a white to gray color. The white to gray color means that the wavelength dependence of reflection characteristics for visible light is small and visible light is easily reflected. Therefore, the light emission efficiency can be further improved, and the light emitted from a light-emitting element can be reflected without any change in its original color.

Among the titanium oxide particles, zinc oxide particles, and aluminum oxide particles, the zinc oxide has a high refractive index and no catalytic activity to photo-degradation and can be preferably used when there is a fear of photo-degradation of the cured product of the thermosetting resin composition in the cured anisotropic conductive paste.

The core particle 1 is used for anisotropic conductive connection, and the surface thereof is formed of a metal material. Examples of the form of the surface coated with a metal material include the form in which the core particle 1 itself is formed of the metal material and the form in which the surface of a resin particle is coated with the metal material, as described above.

If the thickness of the light reflecting layer 3 formed of the inorganic particles 2 is too small relative to the diameter of the core particle 1, a significant reduction in reflectivity occurs. If the thickness is too large, conduction failure occurs. Therefore, the thickness of the light reflecting layer 3 is preferably 0.5 to 50% of the diameter of the core particle 1 and more preferably 1 to 25%.

In the light-reflective conductive particle 10, if the diameter of the inorganic particles 2 constituting the light reflecting layer 3 is too small, a light-reflection phenomenon is less likely to occur. If the diameter is too large, the light reflecting layer is not easily formed. Therefore, the diameter of the inorganic particles 2 is preferably 0.02 to 4 μm, more preferably 0.1 to 1 μm, and particularly preferably 0.2 to 0.5 μm. In this case, from the viewpoint of the wavelength of light to be reflected (i.e., the light emitted from the light-emitting element), the diameter of the inorganic particles 2 is preferably 50% or larger of the wavelength of the light to be reflected so that the light is not transmitted. In this case, examples of the shape of the inorganic particles 2 include an irregular shape, a spherical shape, a scale-like shape, and a needle-like shape. Of these, a spherical shape is preferred in terms of light diffusion effects, and a scale-like shape is preferred in terms of total reflection effects.

The light-reflective conductive particles 10 as shown in FIG. 1A can be produced by a well-known film deposition technique (a so-called mechano-fusion method) in which a large-size powder and a small-size powder are brought into physical collision to form a film composed of the small-diameter particles on the surfaces of the large-size particles. In this case, the inorganic particles 2 bite into and are secured to the metal material on the surfaces of the core particles 1. However, since the inorganic particles are less likely to be fused to each other, a mono-layer of the inorganic particles forms the light reflecting layer 3. Therefore, in the case of FIG. 1A, the thickness of the light reflecting layer 3 may be equivalent to or slightly smaller than the diameter of the inorganic particles 2.

The light-reflective conductive particle 20 shown in FIG. 1B will next be described. The light-reflective conductive particle 20 is different from the light-reflective conductive particle 10 in FIG. 1A in that the light reflecting layer 3 includes a thermoplastic resin 4 serving as an adhesive and that the inorganic particles 2 are secured to each other through the thermoplastic resin 4 and form multiple layers (for example, two or three layers). Since such a thermoplastic resin 4 is contained, the mechanical strength of the light reflecting layer 3 is improved, so that, for example, exfoliation of the inorganic particles is less likely to occur.

To reduce the load on the environment, a halogen-free thermoplastic resin can be preferably used as the thermoplastic resin 4. For example, polyolefin such as polyethylene or polypropylene, polystyrene, or an acrylic resin can be preferably used.

The light-reflective conductive particles 20 can also be produced by the mechano-fusion method. If the particle diameter of the thermoplastic resin 4 used in the mechano-fusion method is too small, its bonding function becomes low. If the diameter is too large, the thermoplastic resin 4 is less likely to adhere to the core particles. Therefore, the particle diameter of the thermoplastic resin 4 is preferably 0.02 to 4 μm and more preferably 0.1 to 1 μm. If the amount added of the thermoplastic resin 4 is too small, its bonding function becomes low. If the amount is too large, aggregates of the particles are formed. Therefore, the amount added of the thermoplastic resin 4 is preferably 0.2 to 500 parts by mass based on 100 parts by mass of the inorganic particles 2 and more preferably 4 to 25 parts by mass.

In the light-reflective anisotropic conductive paste of the present invention, if the amount added of the conductive particles such as the light-reflective conductive particles is too small, conduction failure tends to occur. If the amount is too large, short circuits between traces tend to occur. Therefore, the amount added of the conductive particles is preferably 1 to 100 parts by mass based on 100 parts by mass of the thermosetting resin composition and more preferably 10 to 50 parts by mass.

Preferably, the light-reflective anisotropic conductive paste of the present invention has reflection characteristics that can improve the light emission efficiency of a light-emitting element. More specifically, the cured product of the light-reflective anisotropic conductive paste has a reflectivity (JIS K7105) for light having a wavelength of 450 nm of preferably at least 30%. To achieve such a reflectivity, the reflection characteristics and amount added of the light-reflective conductive particles used and the mixing ratio of the thermosetting resin composition are appropriately adjusted. Generally, when the amount added of light-reflective conductive particles having good reflection characteristics is increased, the reflectivity tends to increase.

The reflection characteristics of the light-reflective anisotropic conductive paste can be evaluated also from its refractive index. This is because when the refractive index of the cured product of the paste is higher than the refractive index of the cured product of the thermosetting resin composition excluding the conductive particles and the light-reflective insulating particles, the amount of light reflected by the boundary between the light-reflective insulating particles and the surrounding cured product of the thermosetting resin composition increases. More specifically, the difference obtained by subtracting the refractive index (JIS K7174) of the cured product of the thermosetting resin composition from the refractive index (JIS K7174) of the light-reflective insulating particles is preferably 0.02 or larger and more preferably 0.2 or larger. Generally, the refractive index of a thermosetting resin composition composed mainly of an epoxy resin is about 1.5.

The light-reflective anisotropic conductive paste of the present invention can be produced by uniformly mixing the light-reflective insulating particles, the conductive particles, and the thermosetting resin composition.

Figure 2:
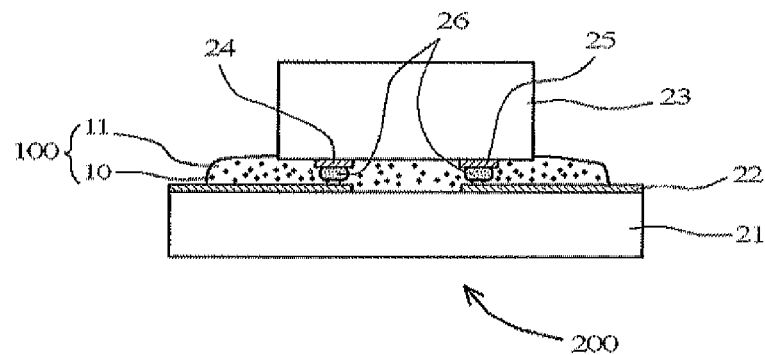
FIG. 2 is a cross-sectional view of a light-emitting device of the present invention.

A light-emitting device of the present invention will next be described with reference to FIG. 2. The light-emitting device 200 includes a substrate 21 and an LED 23 flip-chip mounted thereon through the light-reflective anisotropic conductive paste of the present invention applied to the gap between connection terminals 22 on the substrate 21 and connection bumps 26 formed on an n electrode 24 and a p electrode 25 of the LED 23 used as a light-emitting element. In the cured product 100 of the light-reflective anisotropic conductive paste, the light-reflective conductive particles 10 are dispersed in the cured product 11 of the thermosetting resin composition. If necessary, the light-emitting device may be sealed with a transparent molding resin such that the entire LED 23 is covered. A light reflecting layer may be provided in the LED 23, as in a conventional device.

In the light-emitting device 200 configured as above, light emitted from the LED 23 and directed toward the substrate 21 is reflected by the light-reflective conductive particles 10 in the cured product 100 of the light-reflective anisotropic conductive paste and then emitted from the upper surface of the LED 23. Therefore, a reduction in light emission efficiency can be prevented.

The configuration of the light-emitting device 200 of the present invention except for the light-reflective anisotropic conductive paste (i.e., the configuration of the LED 23, the bumps 26, the substrate 21, the connection terminals 22, and the like) may be the same as the configuration of a conventional light-emitting device. The light-emitting device 200 of the present invention can be produced using a conventional anisotropic conductive connection technique except that the light-reflective anisotropic conductive paste of the present invention is used. Any well-known light-emitting element other than an LED can be used, so long as the effects of the present invention are not impaired. However, an LED can be preferably used because its two electrodes (anode and cathode) are disposed on a surface on one side of the element and therefore the element can be easily mounted.

EXAMPLES

Reference Examples 1 to 4

Synthesis of Sulfonium Borate Complexes

Sulfonium antimonate complexes of the formulas (2a) to (2d) (see Japanese Patent Application Laid-Open Nos. Hei. 10-245378 and 2006-96742 for their synthetic methods) were dissolved in ethyl acetate to prepare 10 mass solutions of these complexes in ethyl acetate. Separately, a 10 mass % aqueous solution of a sodium borate salt of the formula (3) (see Japanese Patent Application Laid-Open No. Hei. 10-310587 for its synthetic methods) was prepared.

Next, each of the 10 mass % ethyl acetate solutions of the antimonate complexes was mixed with an equal molar amount of the 10 mass % aqueous solution of the sodium borate salt of the formula (3) at room temperature, and each mixture was stirred at room temperature for 30 minutes. Then the ethyl acetate layer was separated from each reaction mixture and dried, and the ethyl acetate was removed under reduced pressure. Sulfonium borate complexes of the formulas (1a), (1b), (1c), and (1A) were thereby obtained as evaporation residues.

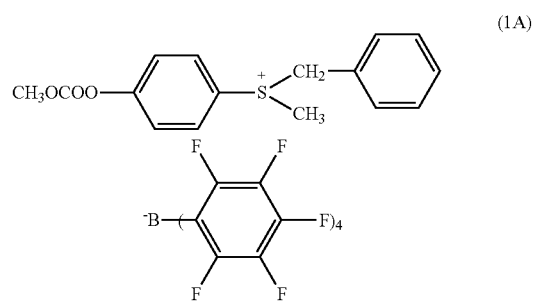

(1A)

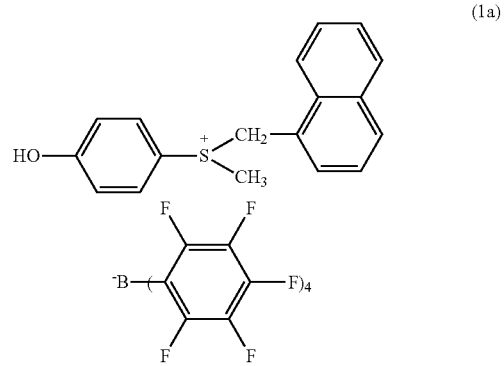

(1a)

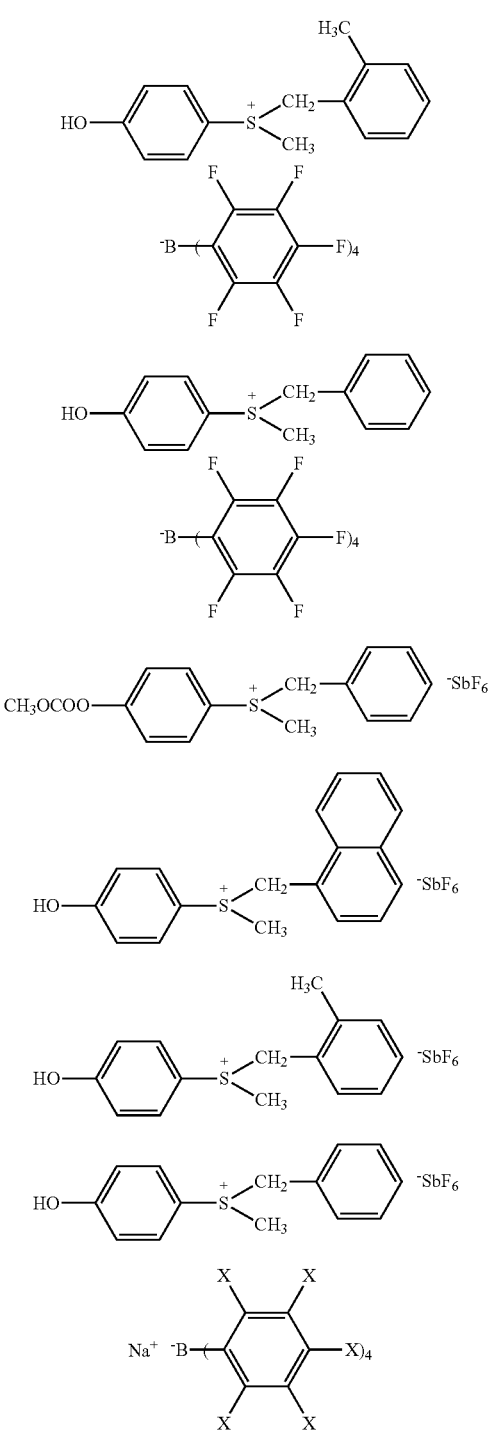

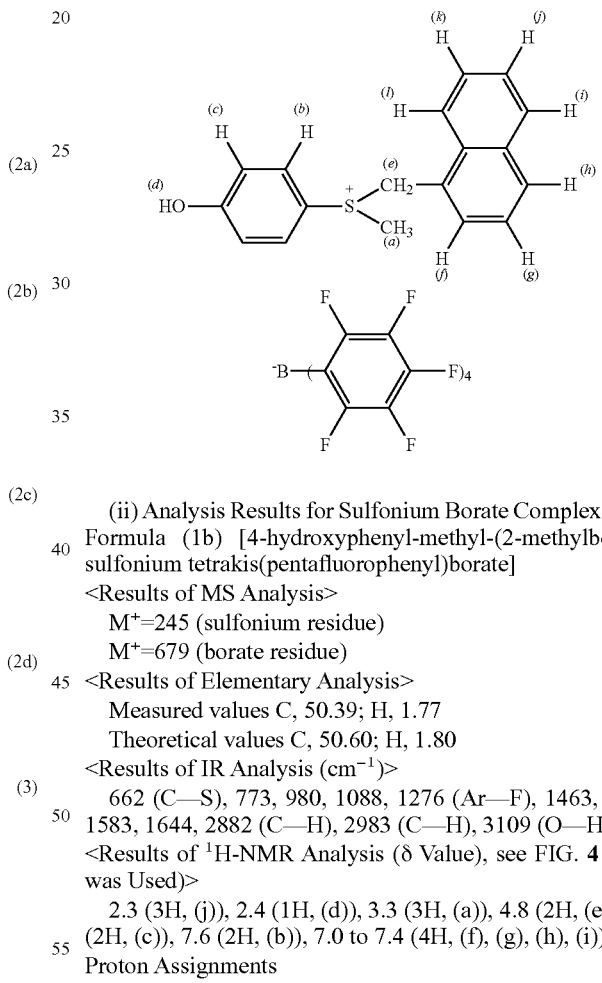

Results

<Results of MS Analysis>
M+=281 (sulfonium residue)
M+=679 (borate residue)

<Results of Elementary Analysis>
Measured values C, 52.51; H, 1.89
Theoretical values C, 52.52; H, 1.78

<Results of IR Analysis (cm$^{-1}$)>
662 (C—S), 776, 980, 1088, 1276 (Ar—F), 1300, 1374, 1464, 1514, 1583, 1643, 2881 (C—H), 2981 (C—H), 3107 (O—H)

Figure 3:
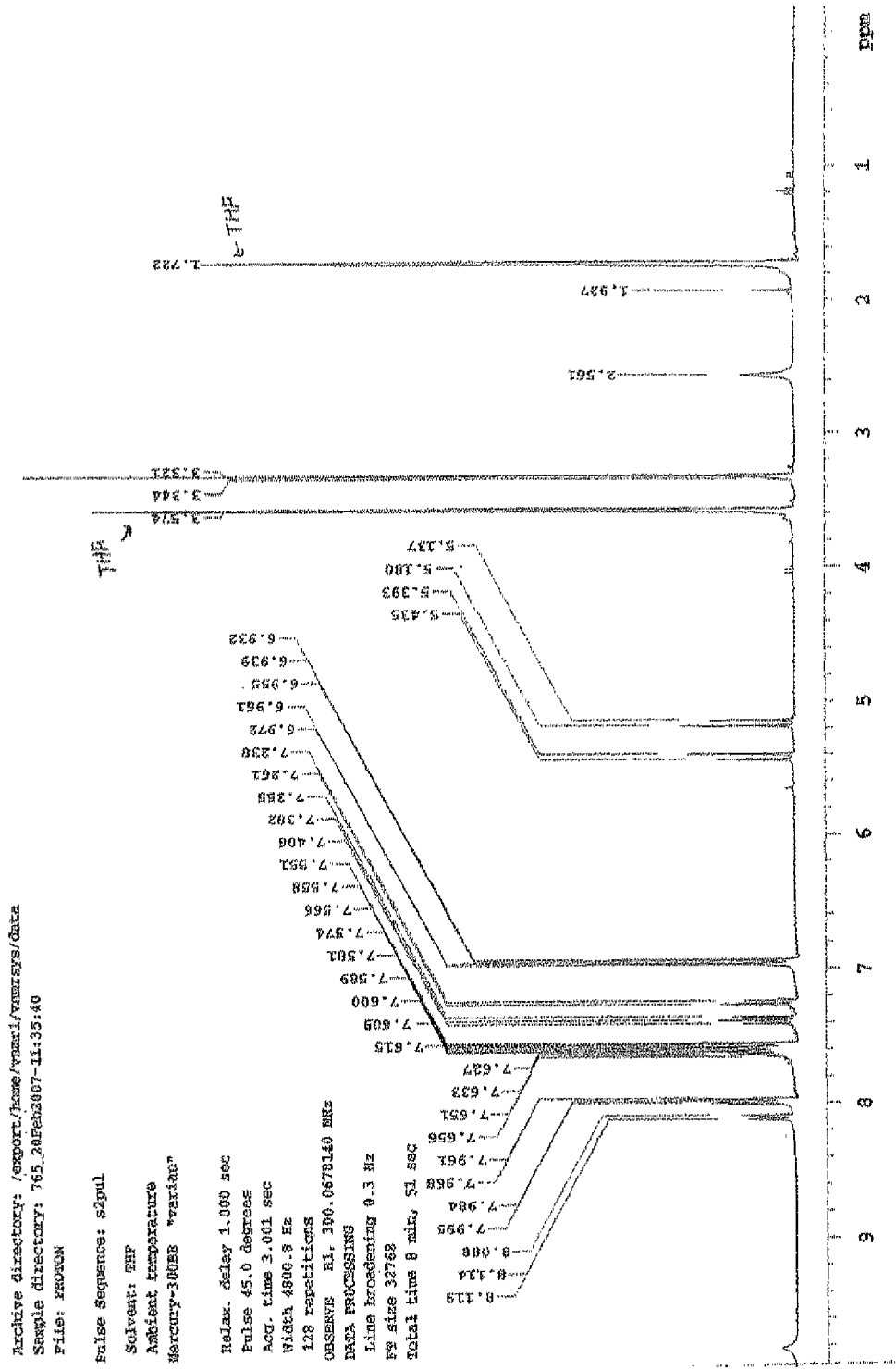
FIG. 3 is a $^1$H-NMR chart of a sulfonium borate complex of the formula (1a).

<Results of $^1$H-NMR Analysis (δ Value), see FIG. 3 (THF was Used)>
2.6 (1H, (d)), 3.3 (3H, (a)), 5.3 (2H, (e)), 6.9 (2H, (c)), 7.6 (2H, (b)), 7.2 to 8.1 (7H, (f), (g), (h), (i), (j), (k), (l))
Proton Assignments (ii) Analysis Results for Sulfonium Borate Complex of the Formula (1b) [4-hydroxyphenyl-methyl-(2-methylbenzyl)sulfonium tetrakis(pentafluorophenyl)borate]

<Results of MS Analysis>
M+=245 (sulfonium residue)
M+=679 (borate residue)

<Results of Elementary Analysis>
Measured values C, 50.39; H, 1.77
Theoretical values C, 50.60; H, 1.80

<Results of IR Analysis (cm$^{-1}$)>
662 (C—S), 773, 980, 1088, 1276 (Ar—F), 1463, 1514, 1583, 1644, 2882 (C—H), 2983 (C—H), 3109 (O—H)

Figure 4:
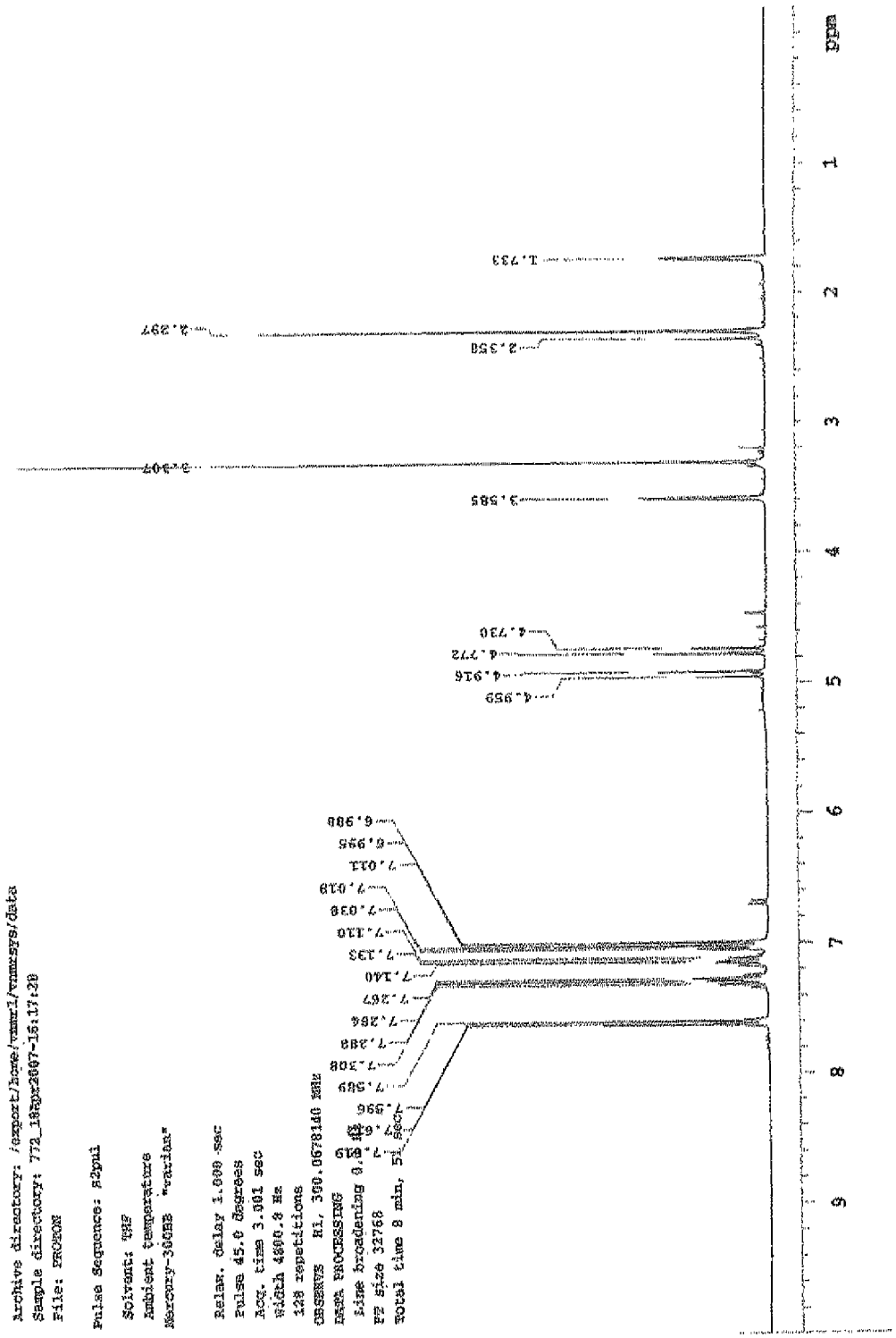
FIG. 4 is a $^1$H-NMR chart of a sulfonium borate complex of the formula (1b).

<Results of $^1$H-NMR Analysis (δ Value), see FIG. 4 (THF was Used)>
2.3 (3H, (j)), 2.4 (1H, (d)), 3.3 (3H, (a)), 4.8 (2H, (e)), 7.0 (2H, (c)), 7.6 (2H, (b)), 7.0 to 7.4 (4H, (f), (g), (h), (i))
Proton Assignments

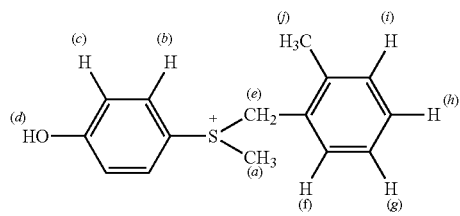

The sulfonium borate complexes of the formulas (1a), (1b), and (1A) were subjected to mass analysis (measurement device: AQUITY HPLC system, WATERS), elementary analysis (measurement device: PHOENIX, EDAX), IR measurement (measurement device: 7000e FT-IR, VARIAN), and $^1$H-NMR analysis (measurement device: MERCURY PLUS, VARIAN). The results obtained for these sulfonium borate complexes showed that target compounds had been obtained.

(i) Analysis of Sulfonium Borate Complex of the Formula (1a) [4-hydroxyphenyl-methyl-1-naphthylmethylsulfonium tetrakis(pentafluorophenyl)borate]

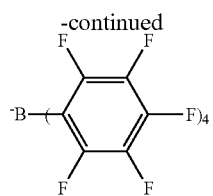

(iii) Analysis Results for Sulfonium Borate Complex of the Formula (1A) in Example 1 [p-methoxycarbonyloxyphenyl-benzyl-methylsulfonium tetrakis(pentafluorophenyl)borate]

<Results of MS Analysis>
$M^+=289$ (sulfonium residue)
$M^+=679$ (borate residue)

<Results of Elementary Analysis>
Measured values agreed with theoretical values.

Figure 5:
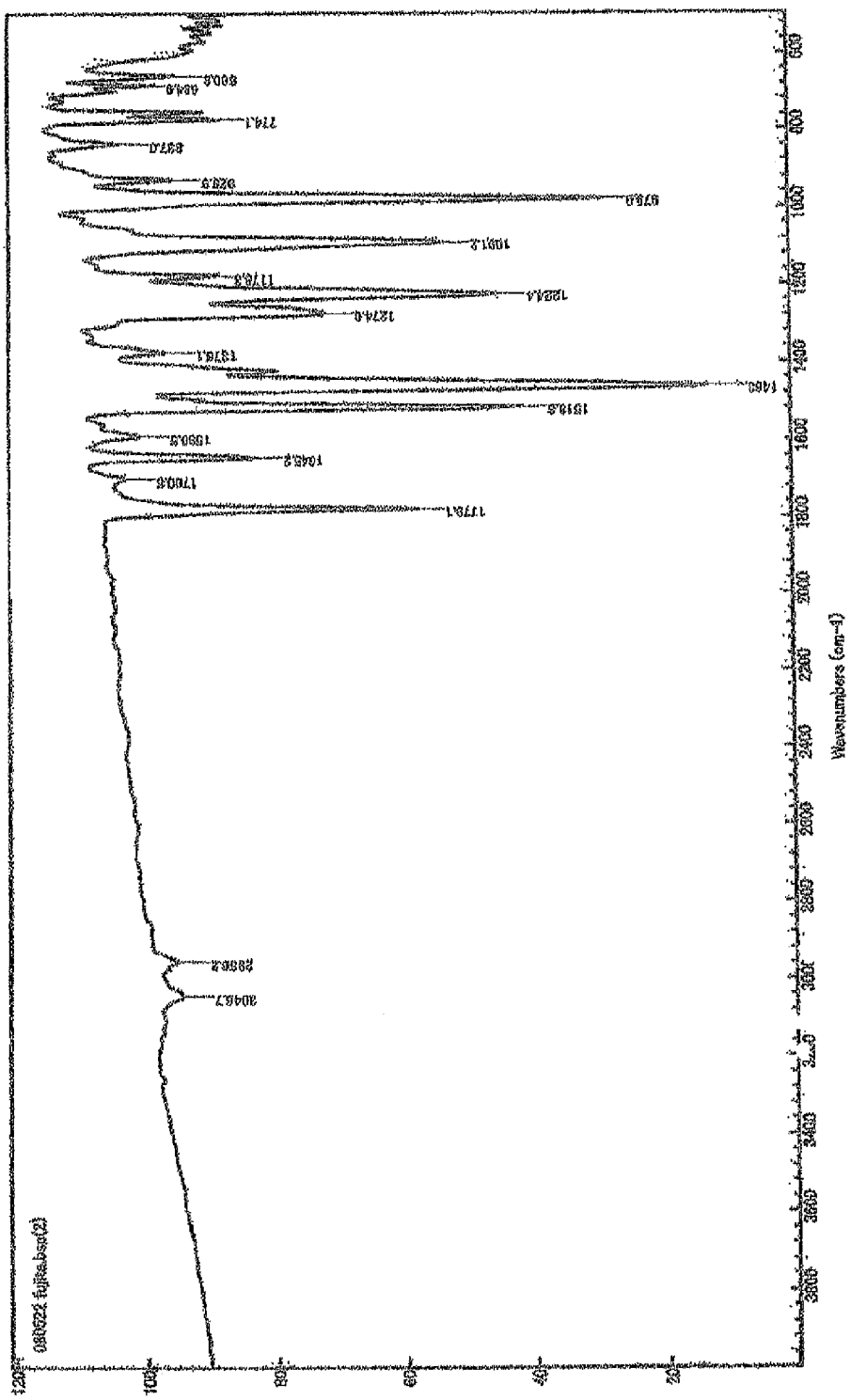
FIG. 5 is an IR chart of a sulfonium borate complex of the formula (1A).

<Results of IR Analysis $(cm^{-1})$>
The IR chart for the measurement results is shown in FIG. 5. The IR characteristic absorptions of bonds in the sulfonium borate complex of the formula (1A) were observed in the IR chart shown in FIG. 5.

Figure 6A:
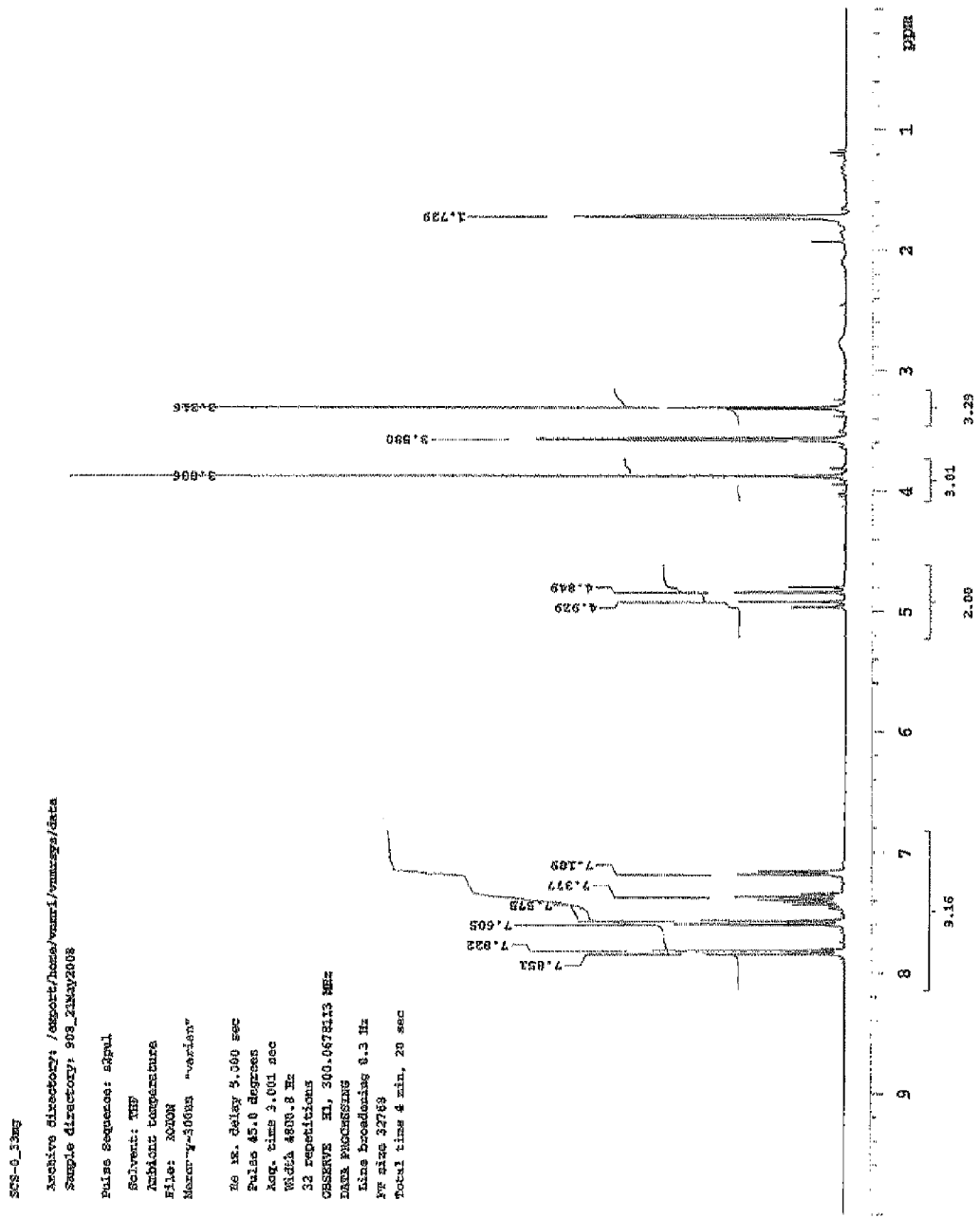
FIG. 6A is a $^1$H-NMR chart of a sulfonium borate complex of the formula (1A).
Figure 6B:
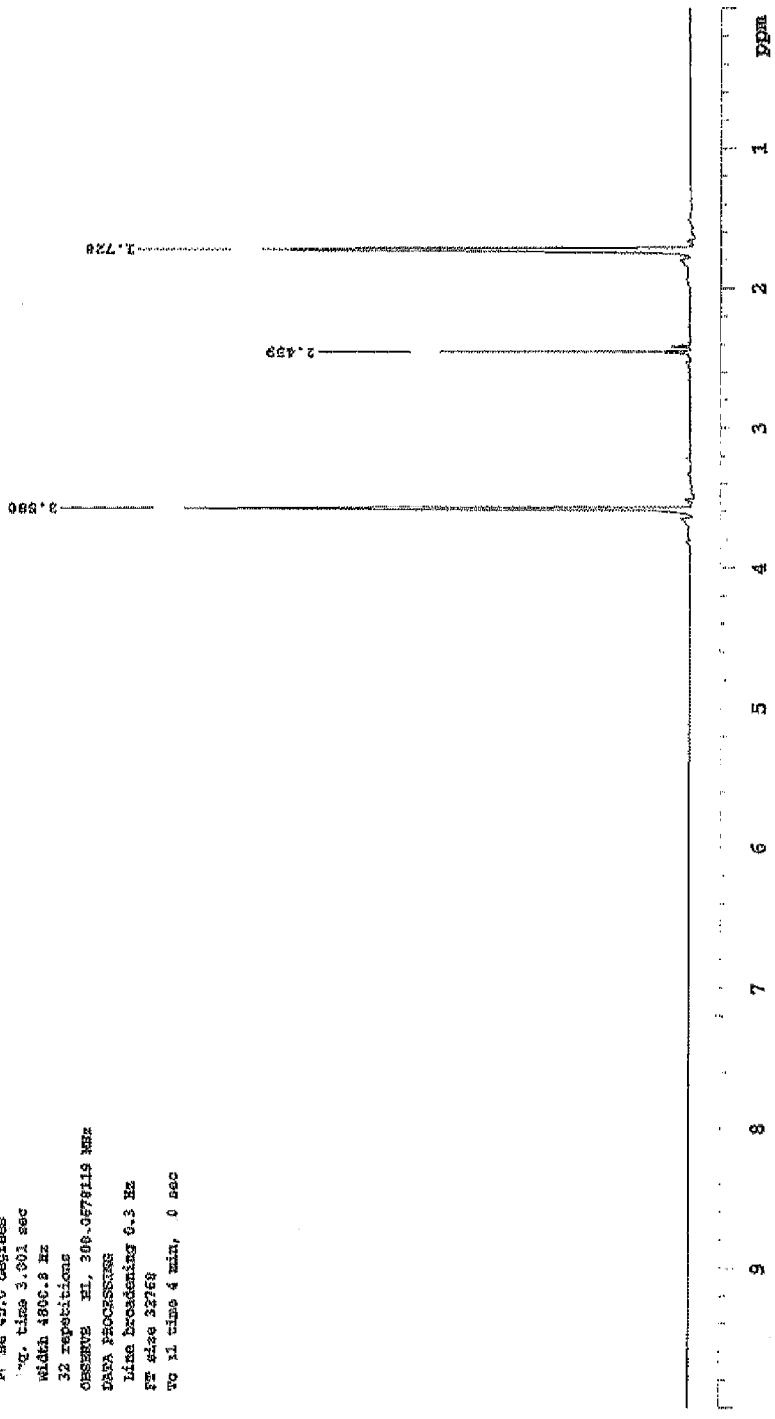
FIG. 6B is a $^1$H-NMR chart of THF.
Figure 7:
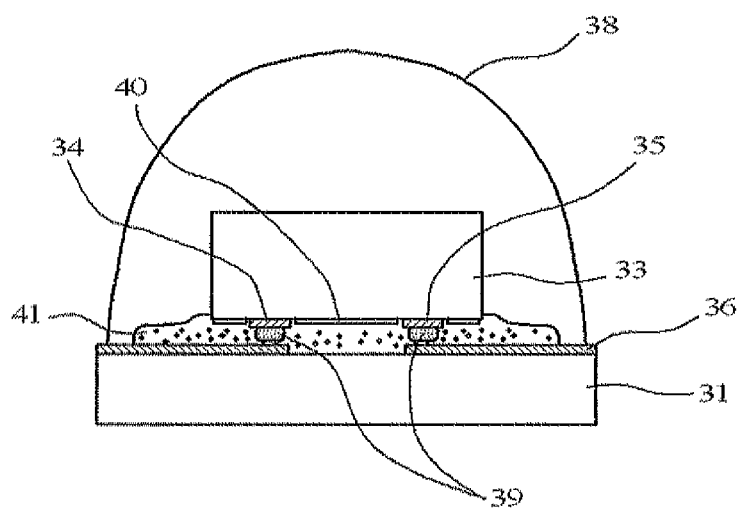
FIG. 7 is a cross-sectional view of a conventional light-emitting device.
Figure 8:
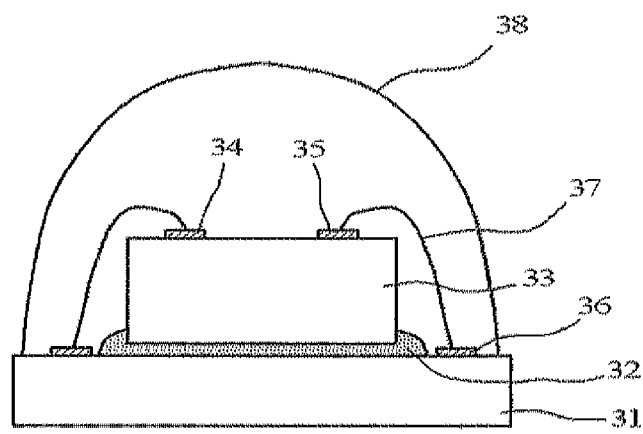
FIG. 8 is a cross-sectional view of a conventional light-emitting device.

<Results of $^1$H-NMR Analysis (δ Value)>
The $^1$H-NMR chart of the measurement results is shown in FIG. 6A, and the $^1$H-NMR chart of a solvent (THF) used as a control is shown in FIG. 6B. In the $^1$H-NMR chart shown in FIG. 6A, the following proton assignments were made.

Proton Assignments

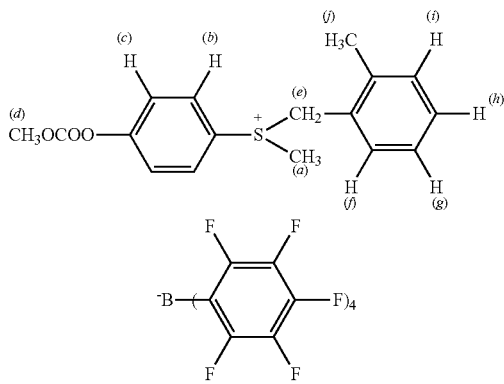

Examples 1 to 16 and Comparative Example 1

Components shown in Table 1 were uniformly mixed in ratios shown in Table 1 using a mixer to obtain light-reflective anisotropic conductive pastes having a white appearance.

The details of the components listed in Table 1 are as follows.

<Epoxy Compounds>
Alicyclic epoxy compound (Celoxide 2021P, Daicel Corporation)
Bisphenol A type epoxy compound (YX8000, Mitsubishi Chemical Corporation)

<Antioxidant>
Alicyclic epoxy hindered phenol-based compound (AO-60, ADEKA CORPORATION)

<Viscosity Modifier>
Silicon oxide (average spherical diameter: 10 to 20 nm, R202, Nippon Aerosil Co., Ltd.)

<Light-Reflective Conductive Particles>
Gold particles (average spherical diameter: 5 μm)

<Light-Reflective Insulating Particles>
Zinc oxide (average spherical diameter: 0.1 to 1 μm, Sakai Chemical Industry Co., Ltd.)

<Acid Anhydride-Based Curing Agent>
Methylhexahydrophthalic anhydride (MH-700, New Japan Chemical Co., Ltd.)

<Imidazole-Based Accelerator>
2-Ethyl-4-methylimidazole (2E4MZ, SHIKOKU CHEMICALS CORPORATION)

<Amine-Based Thermal Catalyst-Type Curing Agent>
2,4,6-Trisdimethylaminomethylphenol (DMP-30, NISSHIN BM CORPORATION)

<Aromatic Sulfonium-Based Thermal Catalyst-Type Curing Agents>
Sulfonium antimonate complexes and sulfonium borate complexes of the formulas (2b), (2c), (2d), (1a), (1b), (1c), and (1A). The sulfonium antimonate complexes of the formulas (2b), (2c), and (2d) are commercially available from SANSHIN CHEMICAL INDUSTRY Co., Ltd. with product names of SI-60, SI-80, SI-100.

<Evaluation>
Each of the obtained light-reflective anisotropic conductive pastes was evaluated for the "amount of volatilization," "adhesion," "conduction reliability,""light reflectivity," and "total luminous flux from an LED-mounted sample," as described below. The results obtained are shown in Table 1.

(Evaluation Test for Volatilization Amount)
5 g of the light-reflective anisotropic conductive paste in one of Examples 1 to 16 and Comparative Example 1 was placed in an aluminum cup with an opening diameter of 50 mm, and the aluminum cup was placed on a hot plate set at 180° C. which is the temperature of anisotropic conductive connection, heated for 30 seconds, and then allowed to cool to room temperature. Then the weight W(g) of the light-reflective anisotropic conductive paste was measured, and the amount of volatilization (%) $[=\{(5-W)/5\}\times100]$ was determined from the measured value. The same procedure was repeated except that the heating time was changed to 1 minute and to 5 minutes, and the amounts of volatilization were thereby determined. Ideally, the amount of volatilization is 0. Practically, the amount of volatilization is preferably less than 0.5%.

(Evaluation Test for Adhesion)
A glass epoxy circuit board plated with Au was coated with one of the light-reflective anisotropic conductive pastes to a dry thickness of 10 μm, and an LED chip having a 6.3 mm square bottom face was temporarily placed thereon and then heated and pressurized under the conditions of 1 N/chip and 180° C. for 30 seconds using a flip-chip bonder to mount the LED chip. The peel strength of the mounted LED ([N/chip], die shear strength measurement, (PTR-1100, RHESCA)) was measured under the conditions of a die shear rate of 20 μm/s at room temperature just after mounting (initial), at room temperature after the mounted chip was left to stand in an environment of 150° C. for 100 hours, and at 150° C. just after mounting (initial). Preferably, the adhesion is 70 N/chip and at least 50 N/chip.

(Evaluation Test for Conduction Reliability)
A glass epoxy circuit board plated with Au was coated with one of the light-reflective anisotropic conductive pastes to a dry thickness of 10 μm, and an IC chip having a 6.3 mm square bottom face was temporarily placed thereon and then heated and pressurized under the conditions of 1 N/chip and 180° C. for 30 seconds using a flip-chip bonder to mount the IC chip. The initial conduction resistance of the mounted product was measured by the four-terminal method. Then the mounted product was subjected to a thermal shock test (TCT:

500 cycles, −55° C. for 0.5 hr↔125° C. for 0.5 hr), and the conduction resistance after the test was measured by the four-terminal method. The results were evaluated according to the following criteria.
Evaluation Criteria
G (good): The conduction resistance was less than 1Ω.
NG (not good): The conduction resistance was 1Ω or larger.
(Evaluation Test for Light Reflectivity)
A white ceramic plate was coated with one of the obtained light-reflective anisotropic conductive pastes to a dry thickness of 100 μm, and the paste was heated at 200° C. for 1 minute to cure the paste. The reflectivity (JIS K7105) of the cured product for light having a wavelength of 450 nm was measured using a spectrophotometer (U3300, Hitachi, Ltd.). The results showed that the light reflectivities of the light-reflective anisotropic conductive pastes in Examples 1 to 16 and Comparative Example 1 were 40 to 42%, because the same type of light-reflective conductive particles in the same amount and the same type of light-reflective insulating particles in the same amount were used. Practically, the reflectivity is desirably 30% or higher.

(Evaluation Test for Total Luminous Flux from LED-Mounted Sample)
Gold bumps with a height of 15 μm were formed on a glass epoxy substrate having 100 μm-pitch copper traces plated with Ni/Au (5.0 μm thick/0.3 μm thick) using a bump bonder (FB700, KAIJO corporation). A blue LED (Vf=3.2 (If=20 mA)) was flip-chip mounted on the epoxy substrate with the gold bumps using one of the light-reflective anisotropic conductive pastes under the conditions of 200° C., 60 seconds, and 1 Kg/chip to obtain an LED module for the test.
The total luminous flux from each of the obtained LED modules for the test was measured using a total luminous flux measurement system (integration sphere type) (LE-2100, Otsuka Electronics Co., Ltd.) (measurement condition: If=20 mA (constant current control)). The results showed that the total luminous flux of each of the light-reflective anisotropic conductive pastes in Examples 1 to 16 and Comparative Example 1 was 523 to 525 mlm, because the same type of light-reflective conductive particles in the same amount and the same type of light-reflective insulating particles in the same amount were used. Practically, the total luminous flux is desirably 300 mlm or higher.

TABLE 1

| | | | Example | | | | | | | | |
|---|---|---|---|---|---|---|---|---|---|---|---|
| | | | 1 | 2 | 3 | 4 | 5 | 6 | 7 | 8 | 9 |
| Alicyclic epoxy compound | Celoxide 2021P | [parts by mass] | 100 | 100 | 100 | 100 | 100 | 100 | 100 | 100 | 100 |
| Bisphenol A-type epoxy compound | YX-8000 | [parts by mass] | | | | | | | | | |
| Antioxidant | AO-60 | [parts by mass] | | | | | | | | | |
| Viscosity modifier | R202 | [parts by mass] | | | | | | | | | |
| Light-reflective conductive particles | Au particles | [parts by mass] | 30 | 30 | 30 | 30 | 30 | 30 | 30 | 30 | 30 |
| Light-reflective insulating particles | ZnO particles | [parts by mass] | 70 | 70 | 70 | 70 | 70 | 70 | 70 | 70 | 70 |
| Acid anhydride-based curing agent | MH-700 | [parts by mass] | | | | | | | | | |
| Imidazole-based accelerator | 2E4MZ | [parts by mass] | | | | | | | | | |
| Amine-based thermal catalyst-type curing agent | DMP-30 | [parts by mass] | 1 | 3 | | | | | | | |
| Aromatic sulfonium-based thermal catalyst-type curing agent | sulfonium antimonate complex of formula (2b) | [parts by mass] | | | 1 | 3 | | | | | |
| | sulfonium antimonate complex of formula (2c) | [parts by mass] | | | | | 1 | 3 | | | |
| | sulfonium antimonate complex of formula (2d) | [parts by mass] | | | | | | | 1 | 3 | |
| | sulfonium borate complex of the formula (1a) | [parts by mass] | | | | | | | | | 1 |
| | sulfonium borate complex of the formula (1b) | [parts by mass] | | | | | | | | | |
| | sulfonium borate complex of the formula (1c) | [parts by mass] | | | | | | | | | |
| | sulfonium borate complex of the formula (1A) | [parts by mass] | | | | | | | | | |
| Amount of volatilization | [wt %](measured after heat treatment at 180° C. for 30 seconds) | | 0 | 0 | 0 | 0 | 0 | 0 | 0 | 0 | 0 |
| | [wt %](measured after heat treatment at 180° C. for 1 minute) | | 0 | 0 | 0 | 0 | 0 | 0 | 0 | 0 | 0 |
| | [wt %](measured after heat treatment at 180° C. for 5 minutes) | | 0 | 0 | 0 | 0 | 0 | 0 | 0 | 0 | 0 |
| Adhesion | [N/chip] initial, measured at room temperature | | 89.9 | 96.0 | 90.1 | 90.0 | 90.0 | 89.8 | 90.1 | 90.0 | 90.0 |
| | [N/chip] measured at room temperature after chip was left to stand at 150° C. for 100 hr | | 79.1 | 79.2 | 78.2 | 78.1 | 77.9 | 78.0 | 68.2 | 68.1 | 91.1 |
| | [N/chip] initial, measured at 150° C. | | 70.5 | 71.2 | 70.1 | 70.2 | 70.0 | 70.1 | 65.4 | 65.2 | 71.5 |
| Conduction reliability | [Ω] initial | | G | G | G | G | G | G | G | G | G |
| | [Ω] after 500 TCT cycles | | G | G | G | G | G | G | G | G | G |

TABLE 1-continued

|  |  |  | Example | | | | | | | Comp. Ex. 1 |
|---|---|---|---|---|---|---|---|---|---|---|
|  |  |  | 10 | 11 | 12 | 13 | 14 | 15 | 16 |  |
| Alicyclic epoxy compound | Celoxide 2021P | [parts by mass] | 100 | 100 | 100 | 100 | 100 | 100 | 100 |  |
| Bisphenol A-type epoxy compound | YX-8000 | [parts by mass] |  |  |  |  |  |  |  | 50 |
| Antioxidant | AO-60 | [parts by mass] |  |  |  |  |  |  |  | 1 |
| Viscosity modifier | R202 | [parts by mass] |  |  |  |  |  |  |  | 5 |
| Light-reflective conductive particles | Au particles | [parts by mass] | 30 | 30 | 30 | 30 | 30 | 30 | 30 | 30 |
| Light-reflective insulating particles | ZnO particles | [parts by mass] | 70 | 70 | 70 | 70 | 70 | 70 | 70 | 70 |
| Acid anhydride-based curing agent | MH-700 | [parts by mass] |  |  |  |  |  |  |  | 40 |
| Imidazole-based accelerator | 2E4MZ | [parts by mass] |  |  |  |  |  |  |  | 1 |
| Amine-based thermal catalyst-type curing agent | DMP-30 | [parts by mass] |  |  |  |  |  |  |  |  |
| Aromatic sulfonium-based thermal catalyst-type curing agent | sulfonium antimonate complex of formula (2b) | [parts by mass] |  |  |  |  |  |  |  |  |
|  | sulfonium antimonate complex of formula (2c) | [parts by mass] |  |  |  |  |  |  |  |  |
|  | sulfonium antimonate complex of formula (2d) | [parts by mass] |  |  |  |  |  |  |  |  |
|  | sulfonium borate complex of the formula (1a) | [parts by mass] | 3 |  |  |  |  |  |  |  |
|  | sulfonium borate complex of the formula (1b) | [parts by mass] |  | 1 | 3 |  |  |  |  |  |
|  | sulfonium borate complex of the formula (1c) | [parts by mass] |  |  |  | 1 | 3 |  |  |  |
|  | sulfonium borate complex of the formula (1A) | [parts by mass] |  |  |  |  |  | 1 | 3 |  |
| Amount of volatilization | [wt %](measured after heat treatment at 180° C. for 30 seconds) | | 0 | 0 | 0 | 0 | 0 | 0 | 0 | 1.0 |
|  | [wt %](measured after heat treatment at 180° C. for 1 minute) | | 0 | 0 | 0 | 0 | 0 | 0 | 0 | 1.5 |
|  | [wt %](measured after heat treatment at 180° C. for 5 minutes) | | 0 | 0 | 0 | 0 | 0 | 0 | 0 | 3.4 |
| Adhesion | [N/chip] initial, measured at room temperature | | 91.0 | 90.0 | 89.8 | 90.0 | 89.9 | 91.0 | 91.0 | 88.0 |
|  | [N/chip] measured at room temperature after chip was left to stand at 150° C. for 100 hr | | 81.2 | 80.9 | 80.8 | 80.7 | 80.5 | 82.3 | 83.0 | 78.4 |
|  | [N/chip] initial, measured at 150° C. | | 71.8 | 71.5 | 71.4 | 71.0 | 70.9 | 72.2 | 72.4 | 35.0 |
| Conduction reliability | [Ω] initial | | G | G | G | G | G | G | G | G |
|  | [Ω] after 500 TCT cycles | | G | G | G | G | G | G | G | NG |

As can be seen from the results shown in Table 1, in each of the light-reflective anisotropic conductive pastes in Examples 1 to 16 in which a thermal catalyst-type curing agent was used, the amount of volatilization during anisotropic conductive connection was 0, and the adhesion and the conduction reliability were preferred. In addition, since the light-reflective conductive particles and also the light-reflective insulating particles were used, the light reflectivity was 30% or higher, and the blue color of the light of 450 nm was reflected without any change in color. The total luminous flux was 300 mlm or higher. Particularly, when the sulfonium borate complex of the formula (1A) was used, the results for adhesion were particularly preferred.

As can be seen from the results for the sulfonium antimonate complex of the formula (2b) exhibiting relatively-low-temperature activity and the results for the sulfonium antimonate complex of the formula (2d) exhibiting relatively-high-temperature activity, adhesion tends to be high when a thermal catalyst-type curing agent exhibiting relatively-low-temperature activity is used.

In Comparative Example 1 in which the acid anhydride-based curing agent was used, since the light-reflective conductive particles and the light-reflective insulating particles were simultaneously used, the light reflectivity was 30% or higher, and the total luminous flux was 300 mlm or higher. However, a significantly large amount of the acid anhydride-based curing agent was volatilized during anisotropic conductive connection, and this caused a significant reduction in adhesion particularly at high temperature. More specifically, the adhesion at 150° C. was equal to or less than one-half the initial adhesion (88 N/chip→35 N/chip). The conduction reliability after the TCT was NG.

INDUSTRIAL APPLICABILITY

The light-reflective anisotropic conductive paste of the present invention uses, as a curing agent added to a thermosetting resin composition containing an epoxy compound as a primary curable component, a thermal catalyst-type curing agent capable of initiating thermal cationic polymerization or thermal anionic polymerization. Therefore, thermal cationic polymerization or thermal anionic polymerization is initiated by the thermal catalyst-type curing agent without addition polymerization reaction, and the polymerization proceeds as a chain reaction, so that the chemical composition of the thermosetting resin composition does not significantly changed by the volatilization of the thermal catalyst-type curing agent during pressurization under heating for anisotropic conductive connection. Accordingly, the reduction in bonding strength and the reduction in connection reliability in a high-temperature environment can be suppressed. In addition, when a light-emitting device is produced by flip-chip mounting a light-emitting element such as a light-emitting diode element (LED) on a wiring board using the anisotropic conductive paste, a reduction in light emission efficiency can be prevented without providing, to the light-emitting element, a light reflecting layer that causes an increase in manufacturing cost. Therefore, the light-reflective anisotropic conductive paste of the present invention is useful for flip-chip mounting of LEDs.

REFERENCE SIGNS LIST 1 core particle
2 inorganic particle
3 light reflecting layer
4 thermoplastic resin
10, 20 light-reflective conductive particle
11 cured product of thermosetting resin composition
21 substrate
22 connection terminal
23 LED
23 n electrode
25 p electrode
26 bump
100 cured product of light-reflective anisotropic conductive paste
200 light-emitting device

The invention claimed is:

1. A light-reflective anisotropic conductive paste used to connect a light-emitting element to a wiring board by anisotropic conductive connection, the light-reflective anisotropic conductive paste comprising a thermosetting resin composition, conductive particles, and light-reflective insulating particles, the conductive particles and the light-reflective insulating particles being dispersed in the thermosetting resin composition, wherein the thermosetting resin composition contains an epoxy compound and a thermal cationic polymerization catalyst-type curing agent in the form of an aromatic sulfonium compound represented by the formula (1):

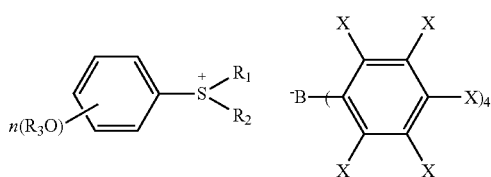

where in the formula (1), $R_1$ is an aralkyl group, $R_2$ is a loweralkyl group, and $R_3$ is a hydrogen atom or a loweralkoxycarbonyl group, X represents a halogen atom, and n is an integer from 1 to 3.

2. The light-reflective anisotropic conductive paste according to claim 1, wherein the aromatic sulfonium compound is a sulfonium borate complex represented by any of the following formulas (1a), (1b), (1c), and (1A):

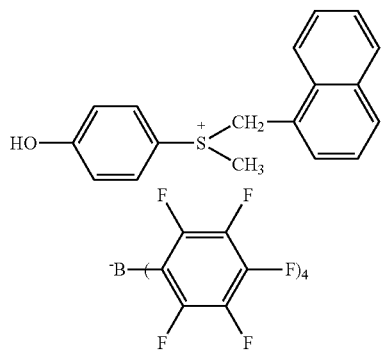

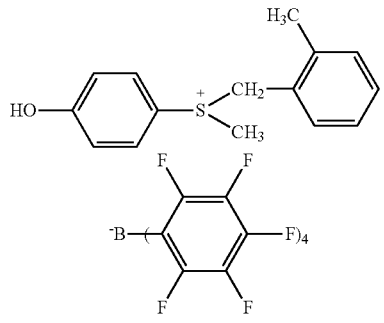

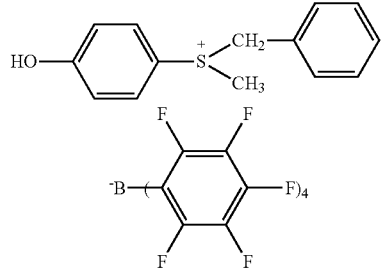

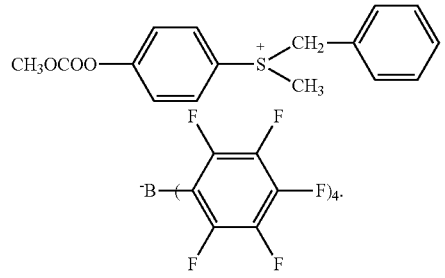

3. The light-reflective anisotropic conductive paste according to claim 1, wherein an amount of the thermal cationic polymerization catalyst-type curing agent added in the thermosetting resin composition is 0.5 to 3 parts by mass based on 100 parts by mass of the epoxy compound.

4. The light-reflective anisotropic conductive paste according to claim 1, wherein each of the light-reflective insulating particles is an inorganic particle selected from the group consisting of titanium oxide, boron nitride, zinc oxide, and aluminum oxide.

5. The light-reflective anisotropic conductive paste according to claim 4, wherein a refractive index (JIS K7142) of the light-reflective insulating particles is larger than a refractive index (JIS K7142) of a cured product of the thermosetting resin composition.

6. The light-reflective anisotropic conductive paste according to claim 1, wherein an amount of the light-reflective insulating particles added is 40 to 120 parts by mass based on 100 parts by mass of the thermosetting resin composition.

7. A light-emitting device comprising a light-emitting element, a wiring board, and the light-reflective anisotropic conductive paste according to claim 1, the light-emitting element being flip-chip mounted on the wiring board through the light-reflective anisotropic conductive paste.

8. The light-emitting device according to claim 7, wherein the light-emitting element is a light-emitting diode element.

9. A light-emitting device comprising a light-emitting element, a wiring board, and the light-reflective anisotropic conductive paste according to claim 1, the light-transmitting element being flip-chip mounted on the wiring board through the light-reflective anisotropic conductive paste.

10. The light-emitting device according to claim 9, wherein the light-emitting element is a light-emitting diode element.

11. A light-reflective anisotropic conductive paste used to connect a light-emitting element to a wiring board by anisotropic conductive connection, the light-reflective anisotropic conductive paste comprising a thermosetting resin composition, conductive particles, and light-reflective insulating particles, the conductive particles and the light-reflective insulating particles being dispersed in the thermosetting resin composition, wherein the thermosetting resin composition contains an epoxy compound and a thermal catalyst-type curing agent, wherein the light-reflective insulating particles are resin-coated metal particles obtained by coating surfaces of scale-like or spherical silver particles with an insulating resin.

12. A light-emitting device comprising a light-emitting element, a wiring board, and the light-reflective anisotropic conductive paste according to claim 11, the light-transmitting element being flip-chip mounted on the wiring board through the light-reflective anisotropic conductive paste.

13. A light-reflective anisotropic conductive paste used to connect a light-emitting element to a wiring board by anisotropic conductive connection, the light-reflective anisotropic conductive paste comprising a thermosetting resin composition, conductive particles, and light-reflective insulating particles, the conductive particles and the light-reflective insulating particles being dispersed in the thermosetting resin composition, wherein the thermosetting resin composition contains an epoxy compound and a thermal catalyst-type curing agent, wherein each of the conductive particles is a light-reflective conductive particle including a core particle coated with a metal material and a light reflecting layer disposed on a surface of the core particle and formed of at least one type of inorganic particle selected from titanium oxide particles, zinc oxide particles, and aluminum oxide particles.

14. The light-reflective anisotropic conductive paste according to claim 13, wherein an amount added of the light-reflective conductive particles is 1 to 100 parts by mass based on 100 parts by mass of the thermosetting resin composition.

15. A light emitting device comprising a light emitting element, a wiring board, and the light-reflective anisotropic conductive paste according to claim 13, the light-transmitting element being flip-chip mounted on the wiring board anisotropic conductive paste.

16. A light-reflective anisotropic conductive paste used to connect a light-emitting element to a wiring board by anisotropic conductive connection, the light-reflective anisotropic conductive paste comprising a thermosetting resin composition, conductive particles, and light-reflective insulating particles, the conductive particles and the light-reflective insulating particles being dispersed in the thermosetting resin composition, wherein the thermosetting resin composition contains an epoxy compound and a thermal catalyst-type curing agent, and each of the light-reflective insulating particles is titanium oxide.

17. The light-reflective anisotropic conductive paste according to claim 16, wherein the epoxy compound is an alicyclic epoxy compound.

18. The light-reflective anisotropic conductive paste according to claim 16, wherein an amount of the thermal catalyst-type curing agent added in the thermosetting resin composition is 0.5 to 3 parts by mass based on 100 parts by mass of the epoxy compound.

19. The light-reflective anisotropic conductive paste according to claim 16, wherein a refractive index (JIS K7142) of the light-reflective insulating particles is larger than a refractive index (JIS K7142) of a cured product of the thermosetting resin composition.

20. The light-reflective anisotropic conductive paste according to claim 16, wherein an amount of the light-reflective insulating particles added is 40 to 120 parts by mass based on 100 parts by mass of the thermosetting resin composition.

21. A light-emitting device comprising a light emitting element, a wiring board, and the light-reflective anisotropic conductive paste according to claim 16, the light-transmitting element being flip-chip mounted on the wiring board through the light-reflective anisotropic conductive paste.

22. An anisotropic conductive paste used to connect a light-emitting element to a wiring board by anisotropic conductive connection, the anisotropic conductive paste comprising a thermosetting resin composition, conductive particles, and light-reflective insulating particles being dispersed in the thermosetting resin composition, wherein the thermosetting resin composition contains an epoxy compound and a thermal catalyst-type curing agent, and the anisotropic conductive paste has a light reflectivity of 30% or higher to a wavelength of 40 nm.

23. A light-emitting device comprising a light-emitting element, a wiring board, and the light-reflective anisotropic conductive paste according to claim 22, the light-transmitting element being flip-chip mounted on the wiring board through the light-reflective anisotropic conductive paste.

* * * * *

UNITED STATES PATENT AND TRADEMARK OFFICE
CERTIFICATE OF CORRECTION

PATENT NO. : 8,710,662 B2
APPLICATION NO. : 13/516005
DATED : April 29, 2014
INVENTOR(S) : Umakoshi et al.

It is certified that error appears in the above-identified patent and that said Letters Patent is hereby corrected as shown below:

On the title page:

Item [73]: delete "Sony Corporation & Information Device Corporation (Tokyo, JP)" and insert -- Dexerials Corporation (Tokyo, JP) --.

Signed and Sealed this
Twenty-third Day of December, 2014

Michelle K. Lee
*Deputy Director of the United States Patent and Trademark Office*